(12) United States Patent
Ku et al.

(10) Patent No.: US 11,784,088 B2
(45) Date of Patent: Oct. 10, 2023

(54) ISOLATION GAP FILLING PROCESS FOR EMBEDDED DRAM USING SPACER MATERIAL

(71) Applicant: Intel Corporation, Santa Clara, CA (US)

(72) Inventors: Chieh-Jen Ku, Hillsboro, OR (US);
Bernhard Sell, Portland, OR (US);
Pei-Hua Wang, Beaverton, OR (US);
Harish Ganapathy, Portland, OR (US);
Leonard C. Pipes, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1000 days.

(21) Appl. No.: 16/260,632

(22) Filed: Jan. 29, 2019

(65) Prior Publication Data
US 2020/0243376 A1 Jul. 30, 2020

(51) Int. Cl.
*H10B 12/00* (2023.01)
*H01L 21/762* (2006.01)

(52) U.S. Cl.
CPC ....... *H01L 21/76283* (2013.01); *H10B 12/01* (2023.02); *H10B 12/20* (2023.02); *H10B 12/50* (2023.02)

(58) Field of Classification Search
CPC ......... H01L 21/76283; H01L 21/76224; H01L 29/0642; H01L 29/0649; H01L 29/0653; H01L 29/78669; H01L 29/78678; H01L 29/66765; H01L 29/66742; H01L 27/10802; H01L 27/10844; H01L 27/10897; H10B 12/20; H10B 12/01; H10B 12/50
See application file for complete search history.

(56) References Cited

U.S. PATENT DOCUMENTS

| 9,000,555 B2 * | 4/2015 | Liu | H01L 21/76202 |
| | | | 438/294 |
| 2014/0070357 A1 * | 3/2014 | Cheng | H01L 27/1203 |
| | | | 257/E21.546 |
| 2016/0225873 A1 * | 8/2016 | Leobandung | H01L 29/78684 |

* cited by examiner

*Primary Examiner* — Sophia T Nguyen
*Assistant Examiner* — John Lin
(74) *Attorney, Agent, or Firm* — Schwabe, Williamson & Wyatt, P.C.

(57) ABSTRACT

Embodiments disclosed herein include transistors and methods of forming such transistors. In an embodiment, the transistor may comprise a semiconductor channel with a first surface and a second surface opposite the first surface. In an embodiment, a source electrode may contact the first surface of the semiconductor channel and a drain electrode may contact the first surface of the semiconductor channel. In an embodiment, a gate dielectric may be over the second surface of the semiconductor channel and a gate electrode may be separated from the semiconductor channel by the gate dielectric. In an embodiment, an isolation trench may be adjacent to the semiconductor channel. In an embodiment, the isolation trench comprises a spacer lining the surface of the isolation trench, and an isolation fill material.

9 Claims, 13 Drawing Sheets

US 11,784,088 B2

ISOLATION GAP FILLING PROCESS FOR EMBEDDED DRAM USING SPACER MATERIAL

TECHNICAL FIELD

Embodiments of the disclosure are in the field of semiconductor structures and processing and, in particular, to embedded DRAM that utilizes a spacer material in the isolation gap.

BACKGROUND

The drive towards increased density and miniaturization in the microelectronics industry has led to many advancements. One advancement is the inclusion of memory components in the back end of line (BEOL) stack. For example, embedded DRAM (e-DRAM) transistors may be included in the BEOL stack. One of the key challenges for e-DRAM processes arises when isolation gap filling materials are used to isolate neighboring e-DRAM transistors from each other. Particularly, the isolation gap filling material is blanket deposited over the device. As such, gap filling material fills isolation trenches between the e-DRAM transistors in addition to covering areas where e-DRAM devices are not located.

This creates several problems. One problem is that the etching chemistry used to recess the isolation gap filling material also attacks the semiconductor thin film material of the e-DRAM transistors. In addition, the isolation gap filling material also needs to be removed from the regions where no e-DRAM transistors are located so that metal and/or via dry etch processes can land on underlying metal layers. If the gap filling material is still present in these areas, the metal and/or via dry etching process is blocked, and may result in metal open issues. Accordingly, current approaches are to use lithographic patterning to selectively remove the isolation gap filling material from the non-e-DRAM regions of the device. Lithographic patterning operations are expensive and time consuming, and therefore it is beneficial to avoid them when possible.

DESCRIPTION OF THE EMBODIMENTS

Figure 1:
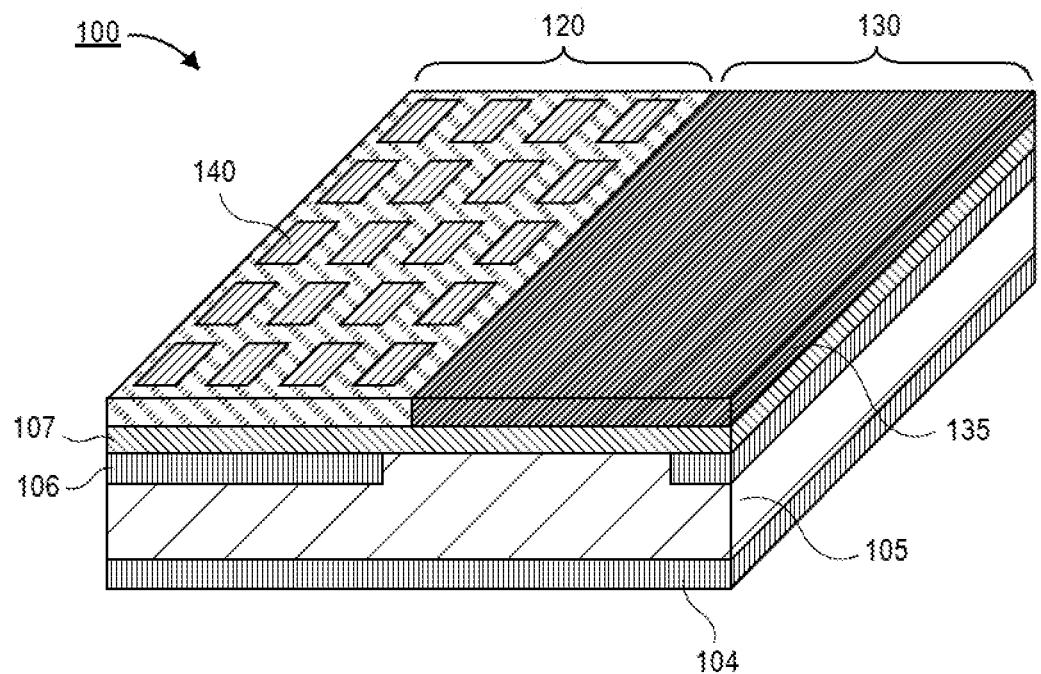
FIG. 1 is a perspective view illustration of a portion of a back end of line (BEOL) stack of a semiconductor die that illustrates an embedded DRAM (e-DRAM) array region and a logic region, in accordance with an embodiment.

Embodiments described herein comprise embedded DRAM (e-DRAM) devices that include a spacer material along the isolation gap and methods of forming such devices. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, e-DRAM devices are currently fabricated with the use of a lithographic patterning operation for clearing the isolation gap filling material from the non-e-DRAM regions (also referred to herein as logic regions). Such processes increase the cost of fabricating such devices. Accordingly, embodiments disclosed herein include a spacer layer that has a modifiable etch resistance. In an embodiment, the spacer may be deposited before the isolation gap filling material is deposited. After the gap filling material is recessed, the spacer remains covered in the isolation trenches, but the portion of the spacer over other areas (e.g., over the logic region) becomes exposed. The exposed portions of the spacer may then be treated to increase the etch rate of the spacer, and subsequently be etched away without the need for lithographic patterning. Accordingly, embodiments disclosed herein allow for a reduction in the cost of fabricating semiconductor dies with e-DRAM arrays since a lithographic patterning operation is omitted compared to the previous implementations described above.

Referring now to FIG. 1, a perspective view illustration of a portion of a semiconductor die 100 is shown, in accordance with an embodiment. In an embodiment, a portion of the back end of line (BEOL) stack of the semiconductor die 100 is shown. For example, metal layer 104 (which may comprise a plurality of metal interconnects) may be formed above other BEOL layers (e.g., interlayer dielectrics (ILD) and other metal layers). In other embodiments, metal layer 104 may be the first metal layer 104 of the BEOL stack and the semiconductor substrate (not shown) may be positioned below metal layer 104. In an embodiment, semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials.

In an embodiment, as is also used throughout the present description, metal layers 104 or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal layers 104 may include barrier layers (e.g., layers including one or more of Ta, TaN, Ti or TiN), stacks of different metals or alloys, etc. Thus, the interconnect lines, metal layers, and/or vias may be a single material layer, or may be formed from several layers, including conductive liner layers and fill layers. Any suitable deposition process, such as electroplating, chemical vapor deposition (CVD) or physical vapor deposition (PVD), may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, an ILD 105 may be formed over the metal layer 104. The ILD 105 may be any suitable dielectric material, as is known in the art. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The ILD material may be formed by techniques, such as, for example, CVD, PVD, or by other deposition methods.

In an embodiment, a second metal layer 106 (which may comprise a plurality of metal interconnects) may be formed over ILD 105. In an embodiment, an etchstop layer 107 may be formed over the second metal layer 106. In an embodiment, an array of e-DRAM devices 140 may be located in an e-DRAM region 120 of the semiconductor die 100. In an embodiment, a logic region 130 may be positioned adjacent to the e-DRAM region 120. The logic region 130 may be free from e-DRAM devices 140. In a particular embodiment, the logic region 130 may be positioned above logic transistors on the semiconductor substrate (not shown). Accordingly, in an embodiment layers in the logic region 130 only include typical BEOL stack materials (e.g., ILDs (such as ILDs 135 and 105) etchstop layers (e.g., etchstop layer 107), and metal layers (e.g., metal layers 104 and 106). This allows for traditional patterning and deposition processes to be implemented in order to provide electrical connections to the logic transistors. As will be described in greater detail below with respect to the process flow, embodiments disclosed herein provide a method of forming e-DRAM transistors without needing lithographic patterning to clear the logic region of incompatible materials.

Figure 2A:
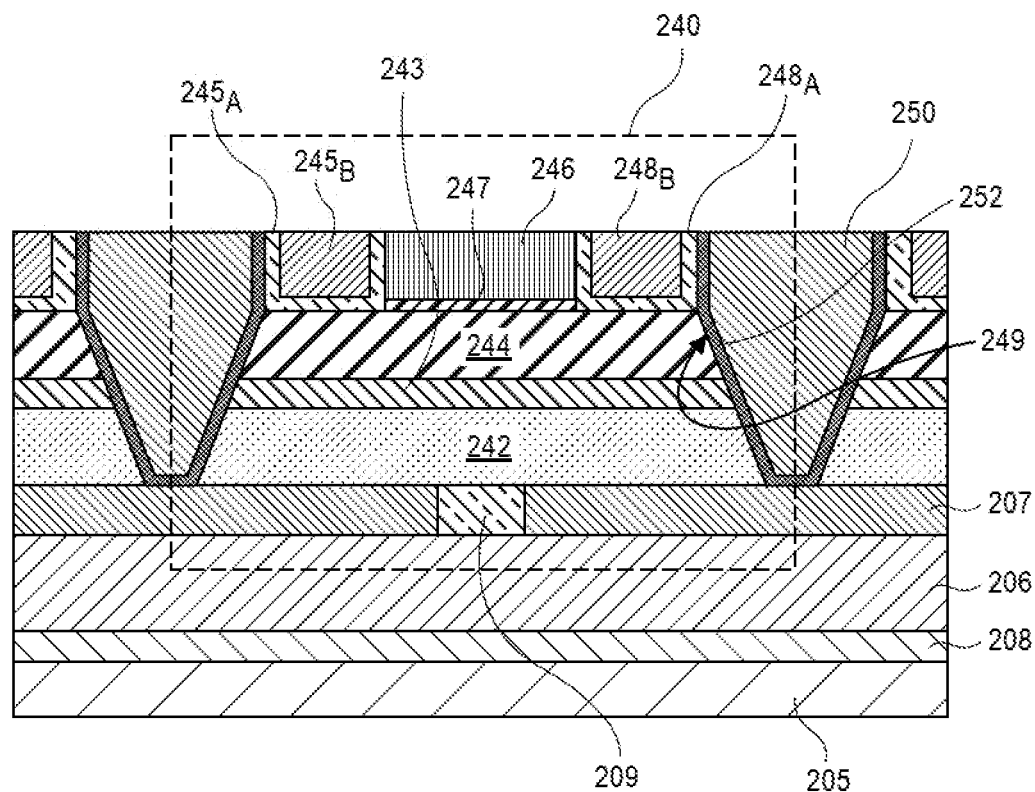
FIG. 2A is a cross-sectional illustration of an e-DRAM transistor that comprises an isolation trench with a spacer, in accordance with an embodiment.

Referring now to FIG. 2A, a cross-sectional illustration of an e-DRAM transistor 240 is shown, in accordance with an embodiment. In an embodiment, the e-DRAM transistor 240 may be positioned in a BEOL stack of a semiconductor die. For example, the e-DRAM transistor 240 may be positioned above an ILD 205 and a metal layer 206. In the illustrated embodiment, a barrier layer 208 is shown between the metal layer 206 and the ILD 205. In an embodiment, an etchstop layer 207 may be positioned over the metal layer 206.

In an embodiment, the e-DRAM transistor 240 may comprise a gate electrode 242. In an embodiment, the gate electrode 242 is positioned over the etchstop layer 207. The gate electrode 242 may be electrically coupled to metal layer 206 by a via 209. In an embodiment, the gate electrode 242 may comprise a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example.

In an embodiment, a gate dielectric 243 may be positioned over the gate electrode 242. The gate dielectric 243 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 243 to improve its quality when a high-k material is used.

In an embodiment, a semiconductor channel 244 may be positioned over the gate dielectric 243. In an embodiment, the semiconductor channel 244 may be any suitable semiconductor material. For example, the semiconductor channel 244 may be amorphous or polycrystalline. In an embodiment, the semiconductor channel 244 may comprise semiconductor oxide materials such as, but not limited to, ZnO, $Al_2O_5Zn_2$ aluminum doped ZnO (AZO), InZnO (IZO), indium tin oxide (ITO), InZnO, $In_2O_3$, $Ga_2O_3$, InGaZnO, semiconductor materials comprising other III-V materials, combinations (e.g., alloys or stacked layers) of semiconductor materials, and the like. In an embodiment, a protective layer 247 may be formed above the semiconductor channel 244. For example, the protective layer 247 may be an oxide a nitride or the like. In an embodiment, a capping layer 246 may be formed over the protective layer 247. For example, the capping layer 246 may be an ILD material, such as an oxide or a nitride.

In an embodiment, a source electrode 245 and a drain electrode 248 may pass through the capping layer 246 to contact the semiconductor channel 244. In an embodiment, the source electrode 245 and the drain electrode may comprise conductive material, or a stack of conductive materials, as is known in the art. For example, in FIG. 2A the source electrode 245 comprises a first metal layer 245A and a second metal layer 245B, and the drain electrode 248 comprises a first metal layer 248A and a second metal layer 245B.

In an embodiment, the e-DRAM transistor 240 may be electrically isolated from neighboring e-DRAM transistors by an isolation trench 250. The isolation trench 250 may be a material that is suitable for electrically isolating e-DRAM transistors 240 in order to prevent or minimize cross-talk. For example, the isolation trench 250 may comprise an oxide, such as $AlO_x$. In an embodiment, the isolation trench 250 may extend from the etchstop layer 207 up to the top surface of the source electrode 245 and drain electrode 248.

In an embodiment, the isolation trench 250 may be lined with a spacer 252. The spacer 252 may be a material that has an etch selectivity that can be modulated. As will be described in greater detail below, the spacer 252 may be a material that is resistant to an etching chemistry used to remove the isolation trench material 250 while in a first state, and is then able to be removed with the etching chemistry after being treated (e.g., with an implantation process) that changes the spacer 252 to a second state. In an embodiment, the portion of the spacer 252 that remains lining the isolation trench material 250 is in the first state. That is, the spacer 252 illustrated in FIG. 2 is an untreated spacer. For example, the spacer 252 may comprise hafnium and oxygen. In an embodiment, the spacer 252 may comprise $SiN$, $SiO_xN_y$, $SiC_xO_yN_z$, $ZrO_x$, or any other dielectric materials.

In an embodiment, the spacer 252 may directly contact sidewall surfaces 249 of the e-DRAM transistor 240. For example, the spacer 252 may directly contact sidewall surfaces of the source electrode 245, the drain electrode 248, the semiconductor channel 244, the gate dielectric 243, and the gate electrode 242. In an embodiment, the spacer 252 may also contact a surface of the etchstop layer 207. In an embodiment, the spacer 252 may have a thickness that is less than 10 nm, less than 5 nm, or less than 3 nm. In an embodiment, a profile of sidewall surfaces 249 may be non-orthogonal to underlying layers. That is, the profile of sidewall surfaces 249 may be tapered, sloped, or the like. In other embodiments, the profile of sidewall surfaces 249 may be substantially vertical.

Figure 2B:
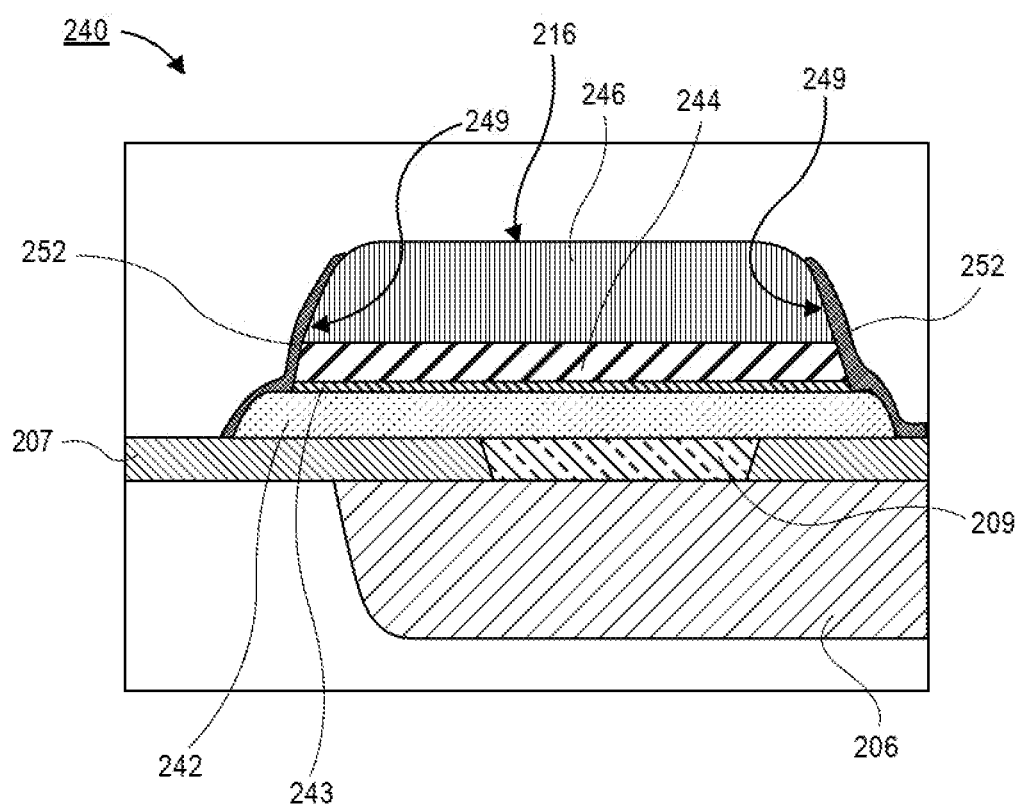
FIG. 2B is a cross-sectional illustration of an exemplary e-DRAM stack that includes a spacers along sidewall surfaces, in accordance with an embodiment.

Referring now to FIG. 2B, a cross-sectional illustration of a micrograph of an e-DRAM transistor 240 is shown, in accordance with an embodiment. As shown, the spacer 252 is formed along sidewalls surfaces 249 of the e-DRAM transistor 240. Particularly, the spacer 252 may be formed in direct contact with the gate electrode 243, the gate dielectric 242, the semiconductor channel 244, and sidewalls of the capping layer 246. While not shown in FIG. 2B, it is to be appreciated that source and drain electrodes may be fabricated into the capping layer 246 (similar to what is shown in FIG. 2A). In such instances, the spacer 252 may then contact sidewall surfaces of the source and drain electrodes. As shown in FIG. 2B, the spacer 252 has been removed from the top surface 216 of the capping layer 246, and from over the top surface of the etchstop layer 207. The process for selectively removing the spacer 252 from these regions is described in greater detail below with respect to FIGS. 3A-3J.

Referring now to FIGS. 3A-3J, a series of cross-sectional illustrations depict a process for fabricating an array of e-DRAM devices in an e-DRAM region 320 while keeping the logic region 330 free from e-DRAM layers without the need for a patterning.

Figure 3A:
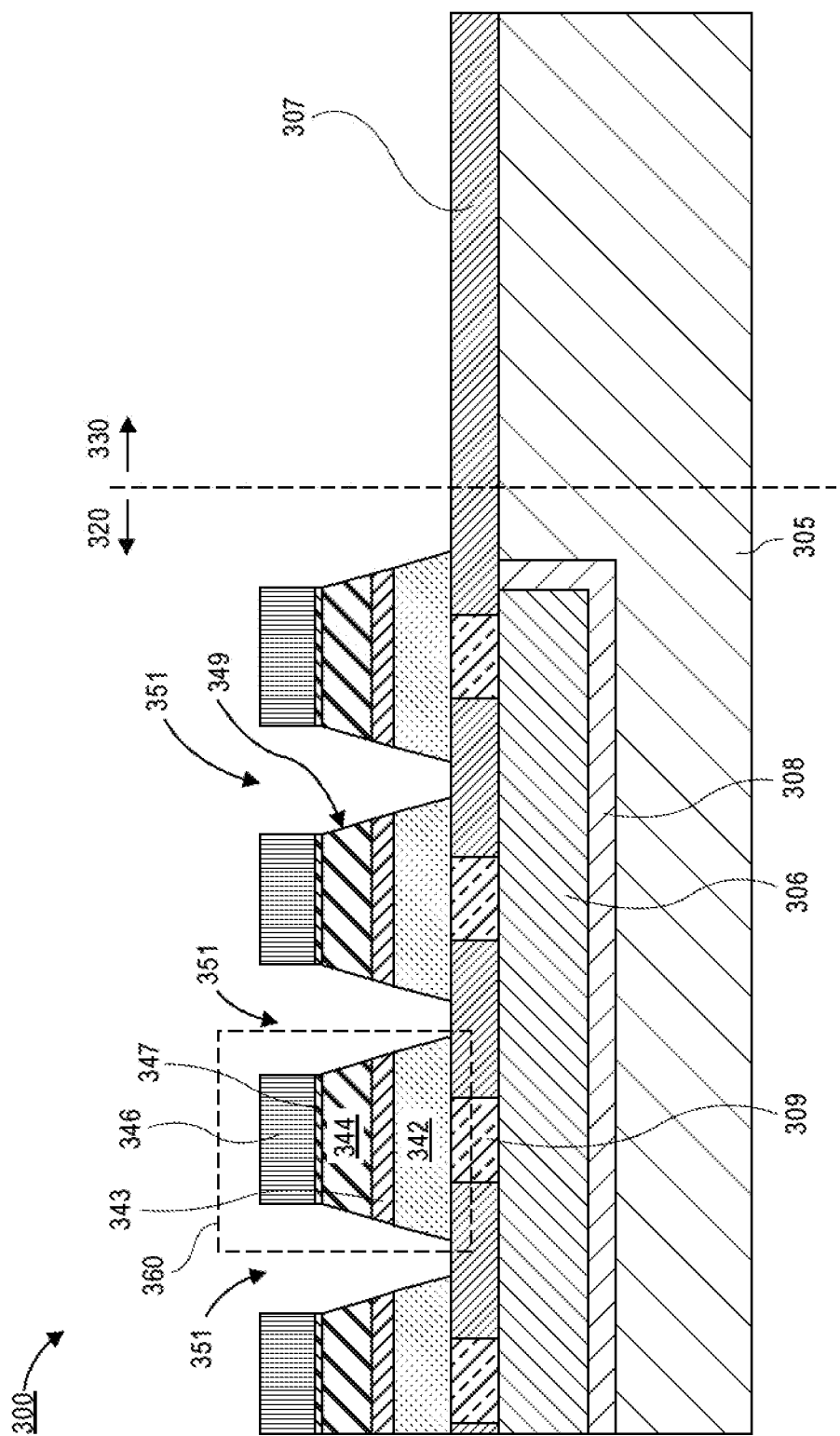
FIG. 3A is a cross-sectional illustration of an e-DRAM array that has been patterned to form a plurality of isolation trenches, in accordance with an embodiment.

Referring now to FIG. 3A, a cross-sectional illustration of a portion of a BEOL stack of a semiconductor die 300 is shown, in accordance with an embodiment. In an embodiment, the semiconductor die 300 comprises a logic region 330 and an e-DRAM array region 320. In FIG. 3A, an ILD 305 is shown as the bottommost layer. However, it is to be appreciated that additional ILD layers, metal layers, and a semiconductor substrate may be formed below the ILD 305. In an embodiment, an etchstop layer 307 may be formed over the ILD 305.

In the e-DRAM array region 320, a plurality of e-DRAM stacks 360 are formed. In an embodiment, the plurality of e-DRAM stacks 360 may be fabricated by forming a plurality of trenches 351 through the various layers (e.g., through the capping layer 346, the protective layer 347, the channel layer 344, the gate dielectric layer 343, and the gate electrode layer 342). In an embodiment, the sidewall surfaces 349 of the e-DRAM stacks 360 may be non-vertical. That is, the sidewall surfaces 349 may have a tapered or sloped profile. In other embodiments, the sidewall surfaces 349 may have substantially vertical profiles.

In an embodiment, the gate electrode 342 in each e-DRAM stack 360 may be electrically coupled to a metal layer (e.g., metal trace 306 and barrier layer 308) formed below the etchstop layer 307. For example, vias 309 may electrically couple each gate electrode 342 to the metal trace 306.

Figure 3B:
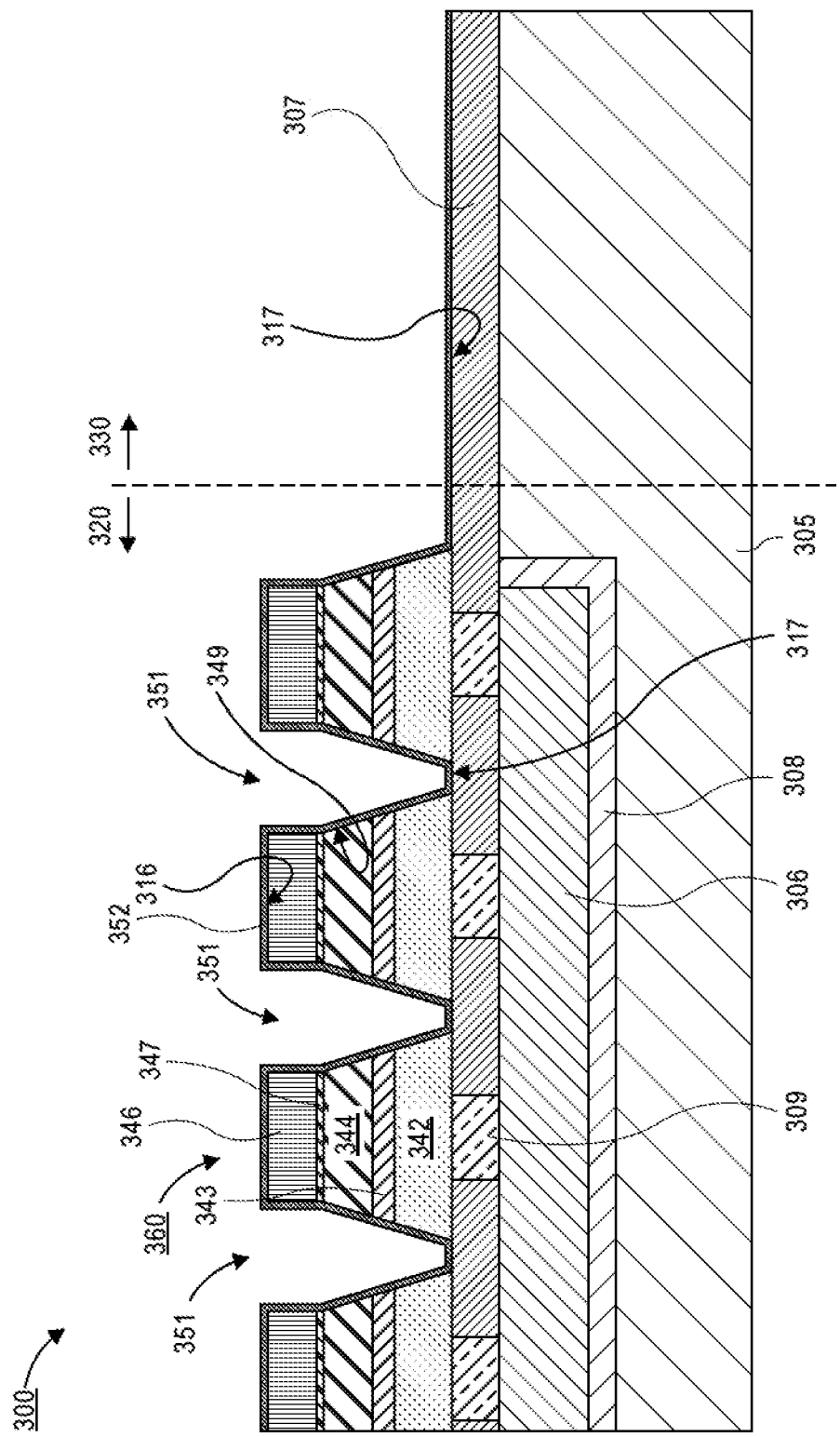
FIG. 3B is a cross-sectional illustration of the e-DRAM array after a spacer has been formed over exposed surfaces, in accordance with an embodiment.

Referring now to FIG. 3B, a cross-sectional illustration of the semiconductor die 300 is shown after a spacer layer 352 is formed over the exposed surfaces. In an embodiment, the spacer layer 352 is deposited with a conformal deposition process. Accordingly, in an embodiment the spacer layer 352 is deposited on all exposed surfaces. For example, the spacer layer 352 is formed over the sidewall surfaces 349 of the e-DRAM stacks 360, over top surfaces 316 of the capping layer 346, and over exposed portions of the surface 317 of the etchstop layer 307. In an embodiment, the spacer layer 352 is deposited over the e-DRAM array region 320 and the logic region 330.

In an embodiment, the spacer layer 352 may have a thickness that is 10 nm or less, 5 nm or less, or 3 nm or less. The spacer layer 352 may be deposited with a suitable conformal deposition process. For example, the spacer layer 352 may be deposited with a CVD process, an ALD process, or the like. In an embodiment, the spacer layer 352 may comprise a material that has a high etch resistance to an etching chemistry used to remove the isolation layer in a subsequent processing operation. For example, the spacer layer 352 may have a high etch resistance to a wet etching chemistry, such as dilute HF (DHF). Furthermore, the spacer layer 352 may comprise a material that may be modified to reduce the etch resistance of the spacer layer 352, as will be described in greater detail below. In a particular embodiment, the spacer layer 352 may comprise hafnium oxide.

Figure 3C:
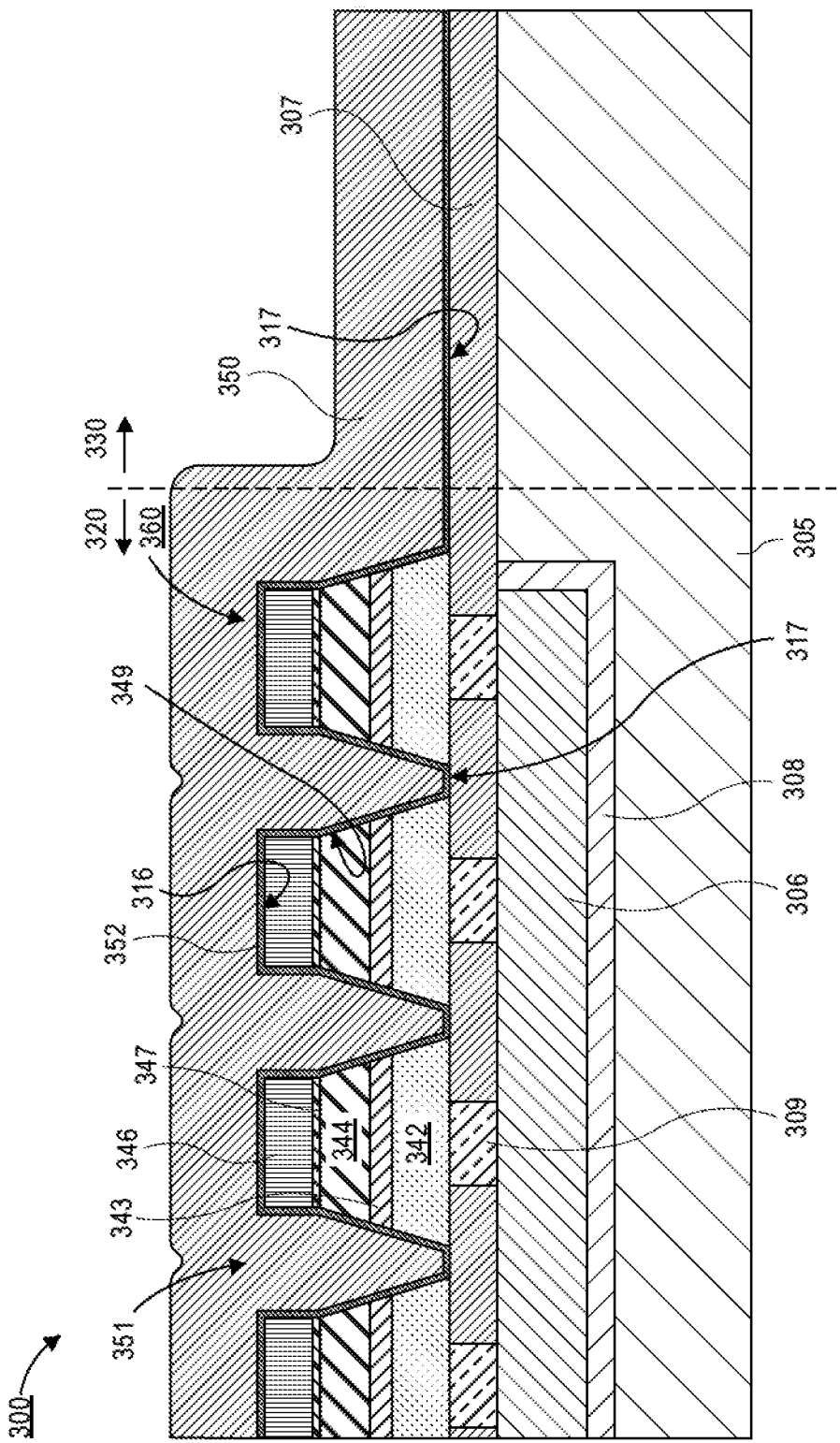
FIG. 3C is a cross-sectional illustration of the e-DRAM array after a trench filling material is disposed into the isolation trenches, in accordance with an embodiment.

Referring now to FIG. 3C, a cross-sectional illustration after an isolation trench layer 350 is deposited. In an embodiment, the isolation trench layer 350 may be a material that is suitable for electrically isolating neighboring e-DRAM stacks 360. Particularly, the isolation trench layer 350 may be deposited with a blanket deposition process. Accordingly, the isolation trench layer 350 may fill the trenches 351 between the e-DRAM stacks 360 and may also be deposited over the spacer layer 352 in the logic region 330. In the illustrated process flow, a single deposition process is depicted to form the isolation trench layer 350. However, it is to be appreciated that the isolation trench layer 350 may be formed with a first deposition process (e.g., a conformal deposition process) and a second deposition process in order to provide better gap fill of the trenches 351. In an embodiment, the isolation trench layer 350 may be any suitable oxide, such as aluminum oxide.

Figure 3D:
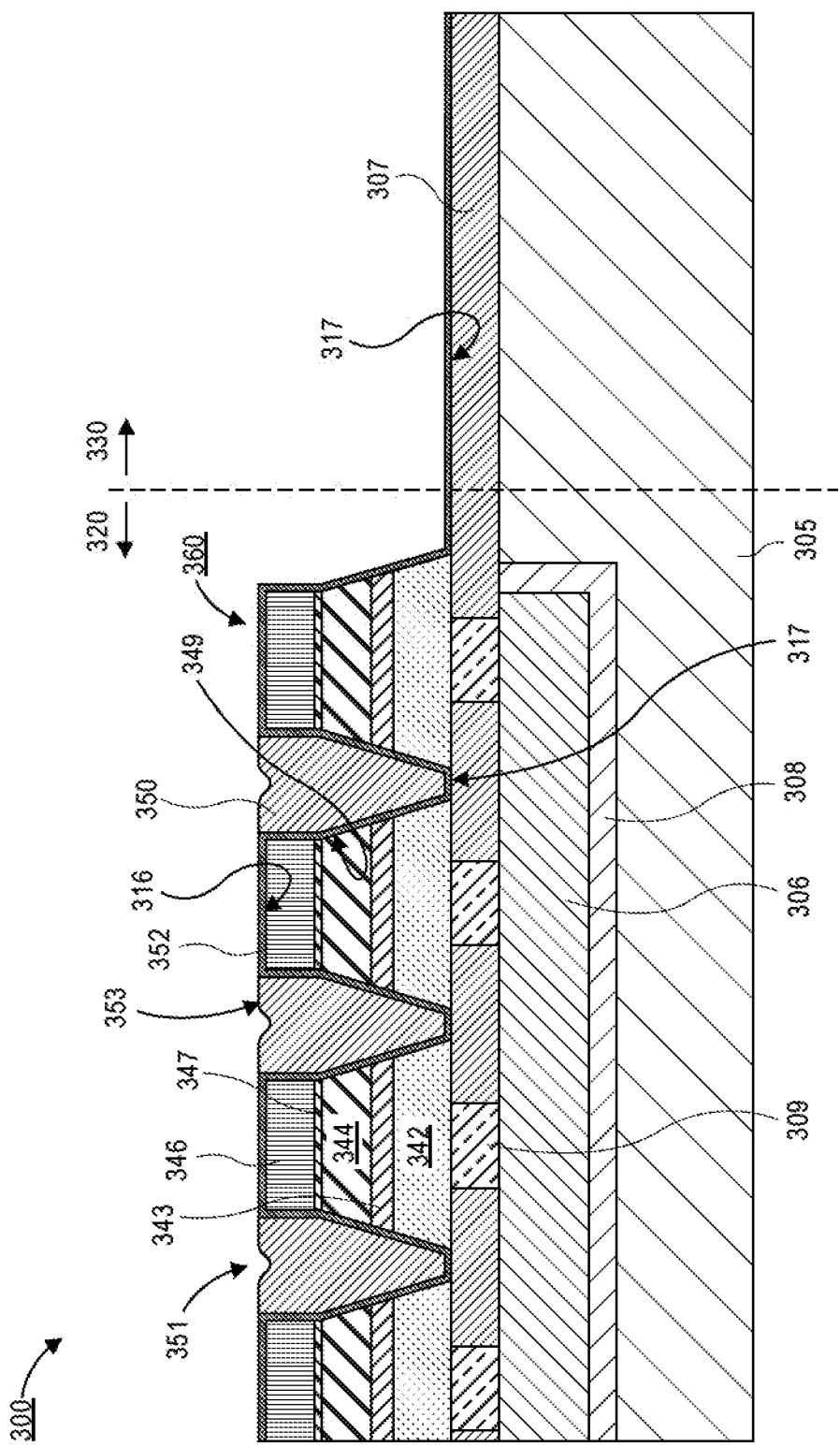
FIG. 3D is a cross-sectional illustration of the e-DRAM array after the trench filling material is recessed, in accordance with an embodiment.

Referring now to FIG. 3D, a cross-sectional illustration after the isolation trench layer 350 is recessed is shown, in accordance with an embodiment. In an embodiment, the isolation trench layer 350 may be recessed with an etching process, such as a wet etching process. For example, the wet etching process may include an etching chemistry such as DHF. In an embodiment, the etching process clears the isolation trench layer 350 from the logic region 330. Furthermore, the isolation trench layer 350 is recessed so that top surfaces 353 of the isolation trench layer 350 are below top surfaces of the spacer layer 352 formed over the top surfaces of the capping layer 316. Since the spacer layer 352 is resistant to the etching chemistry used to recess the isolation trench layer 350, the e-DRAM stack 360 is protected from damage during the etching process.

At this point, portions of the spacer layer 352 are now exposed. Particularly, the exposed portions of the spacer layer 352 (e.g., over the etchstop surface 317 in the logic region 330, and over the top surface 316 of the capping layer 346) need to be removed in order to continue with standard processing in order to finish fabrication of the device. Previously, as described above, a lithographic patterning operation would need to be implemented to clear the logic region 330 of any non-compatible layers. However, embodiments disclosed herein include a blanket surface treatment that may be used to modify the exposed portions of the spacer layer 352.

Figure 3E:
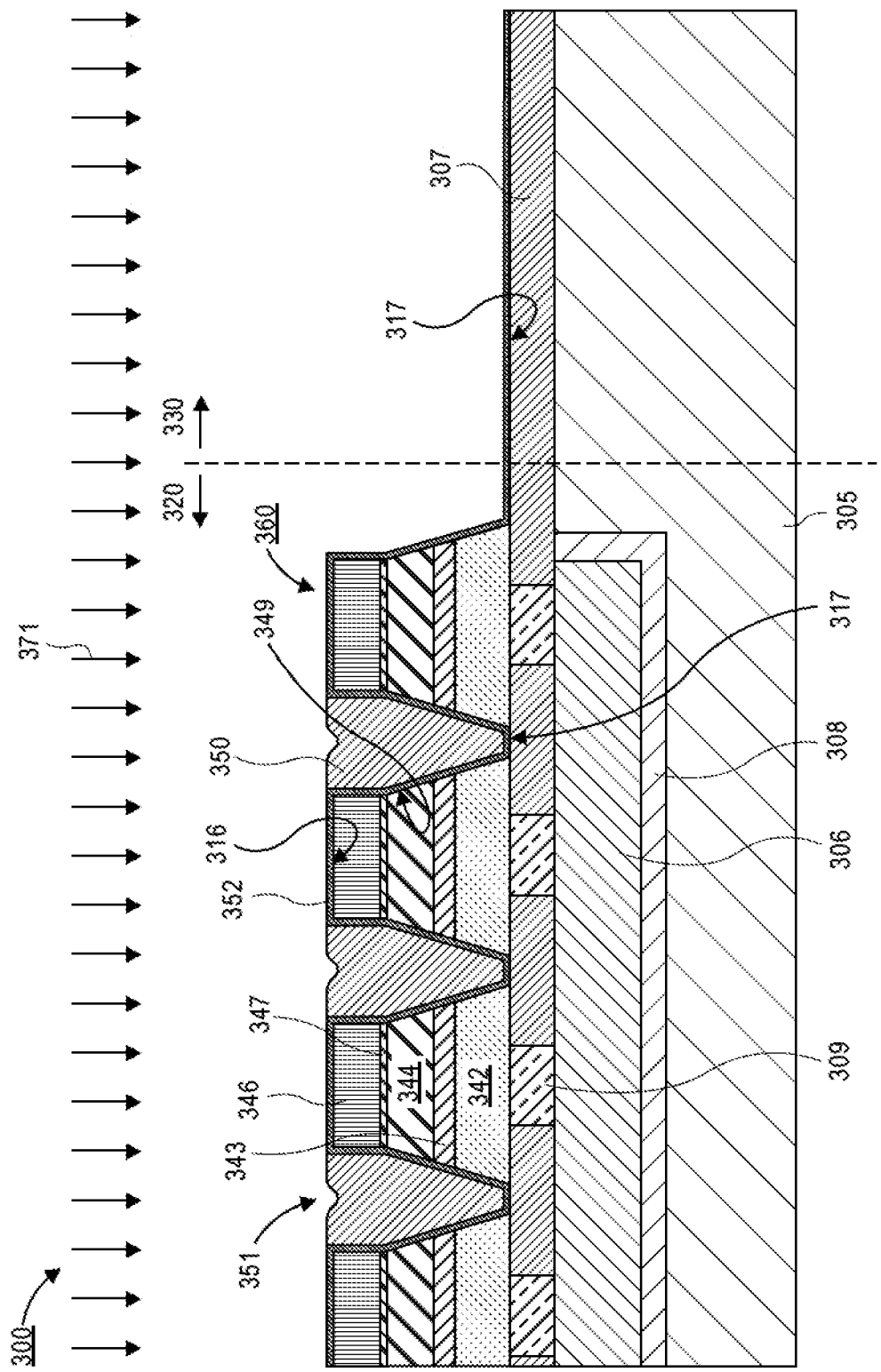
FIG. 3E is a cross-sectional illustration of the e-DRAM array after the exposed portions of the spacer is modified with an implantation process, in accordance with an embodiment.

Referring now to FIG. 3E, a cross-sectional illustration of a treatment process is shown, in accordance with an embodiment. In an embodiment, the treatment process may comprise an ion implantation operation. For example ions are implanted into the exposed surfaces of the device 300, as indicated by the arrows 371. In an embodiment, the ions may include one or more of silicon (Si), boron (B), carbon (C), and fluorine (F). The implantation of the ions 371 into the spacer layer 352 reduces the etch resistance of the spacer layer 352. Particularly, the modified spacer layer 352 may now be susceptible to a wet etching chemistry, such as DHF. As shown, only portions of the spacer layer 352 are subjected to ion implantation. Particularly, the isolation trench layer 350 protects the spacer layer 352 in the trenches 351 from being modified. Accordingly, the etch resistance of the portions of the spacer layer 352 protected by the isolation trench layer 350 remains to continue protecting sidewalls 349 of the e-DRAM stacks 360.

Figure 3F:
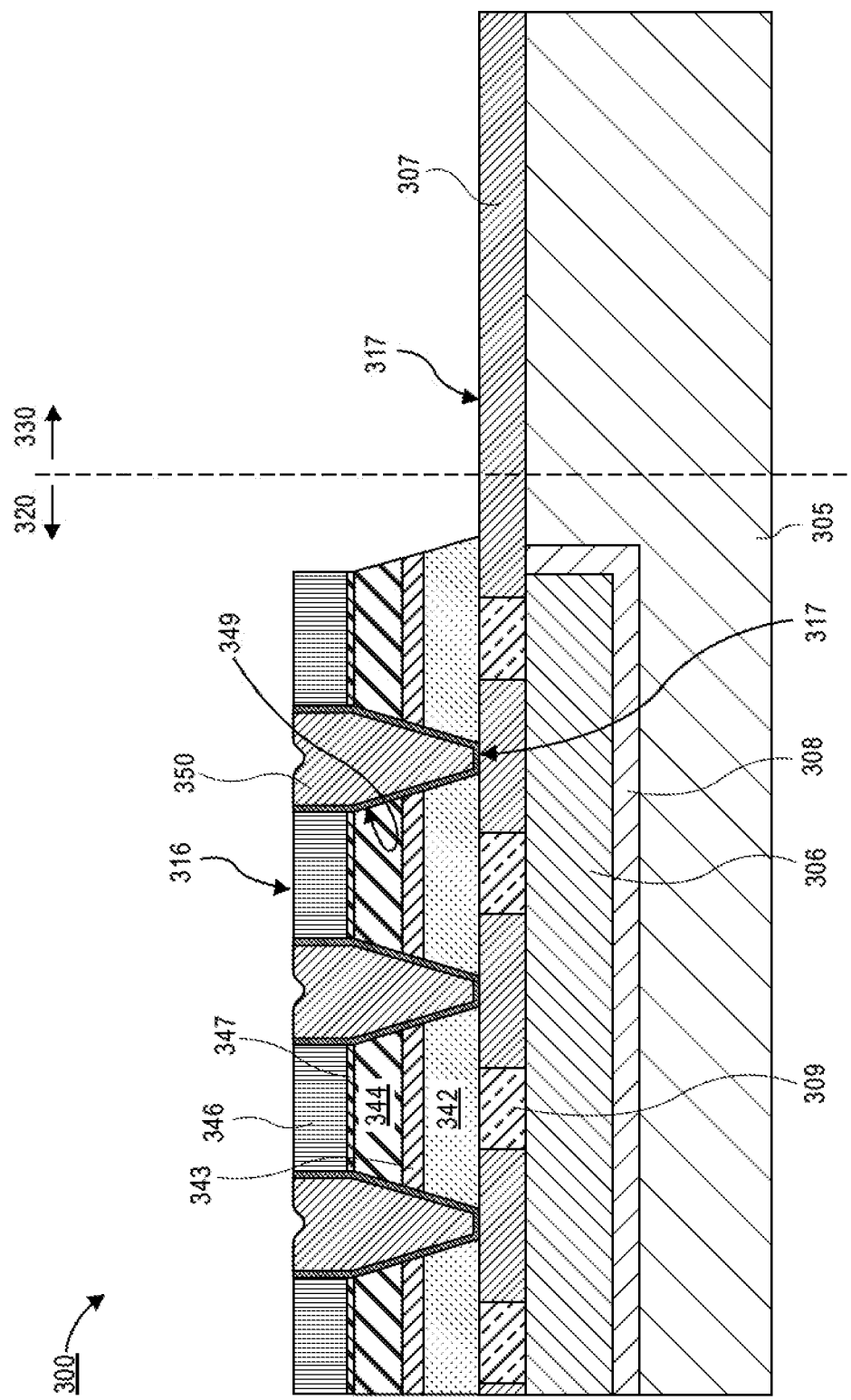
FIG. 3F is a cross-sectional illustration of the e-DRAM array after the exposed portions of the spacer are removed, in accordance with an embodiment.

Referring now to FIG. 3F, a cross-sectional illustration after the modified portions of the spacer layer 352 are removed is shown, in accordance with an embodiment. In an embodiment, the portions of the spacer layer 352 may be removed with a wet etching process, such as with a DHF etching chemistry. Accordingly, the logic region 330 is now cleared of any material layer used to fabricate the e-DRAM transistors without the need for a lithographic patterning operation. In an embodiment, top surfaces 316 of the capping layer 346 may also be exposed in order to allow subsequent processing operations to form the source and drain electrodes.

Figure 3G:
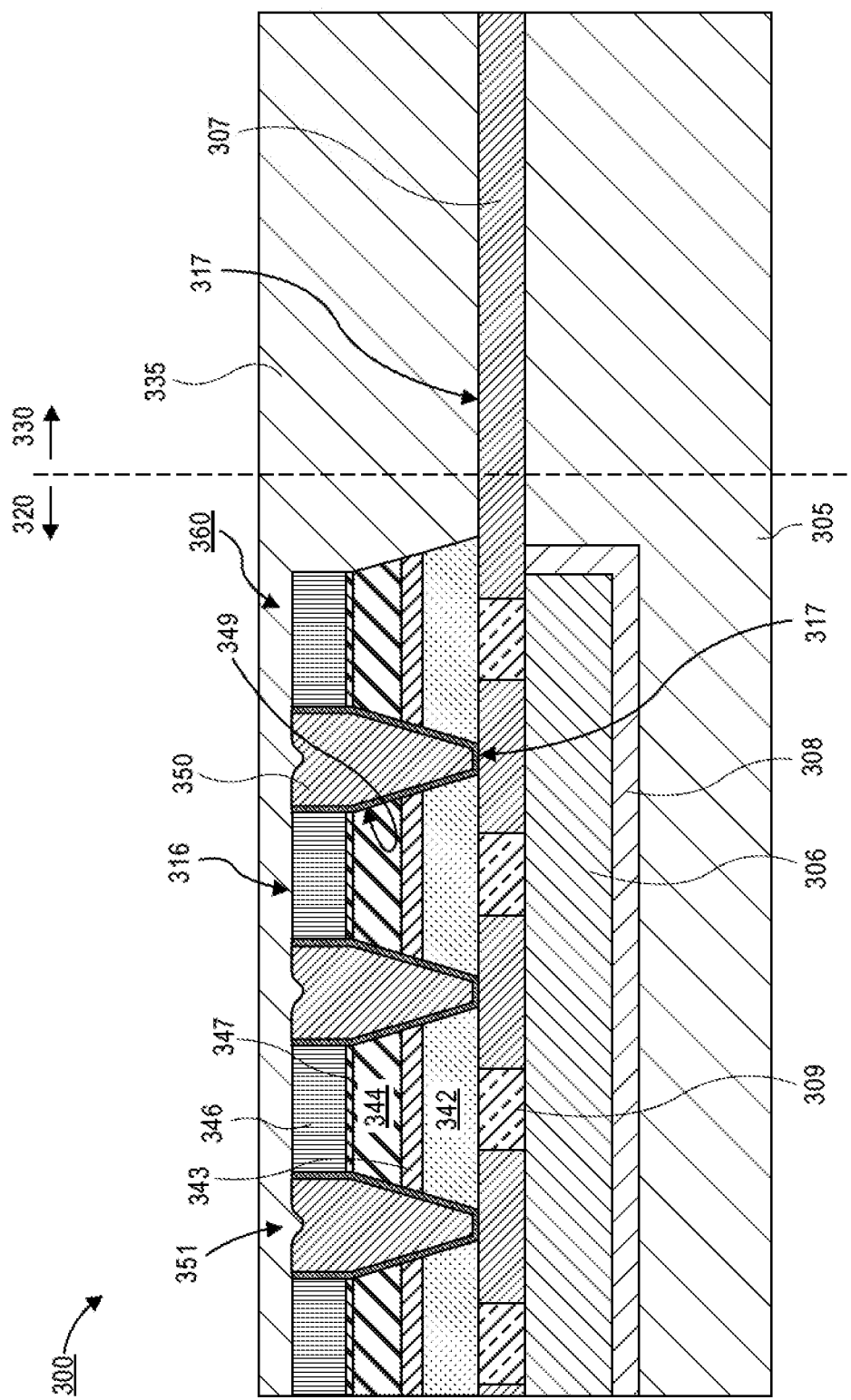
FIG. 3G is a cross-sectional illustration of the e-DRAM array after an interlayer dielectric (ILD) is formed over the e-DRAM array, in accordance with an embodiment.

Referring now to FIG. 3G, a cross-sectional illustration after a second ILD layer 335 is deposited and recessed is shown, in accordance with an embodiment. In an embodiment, the second ILD layer 335 may be any suitable low-k ILD material, such as those described above. At this point, the logic region 330 is now identical to normal metal/via stacks. Accordingly, further processing (e.g., metal interconnect and via formations) may be implemented in accordance with standard processing operations.

Figure 3H:
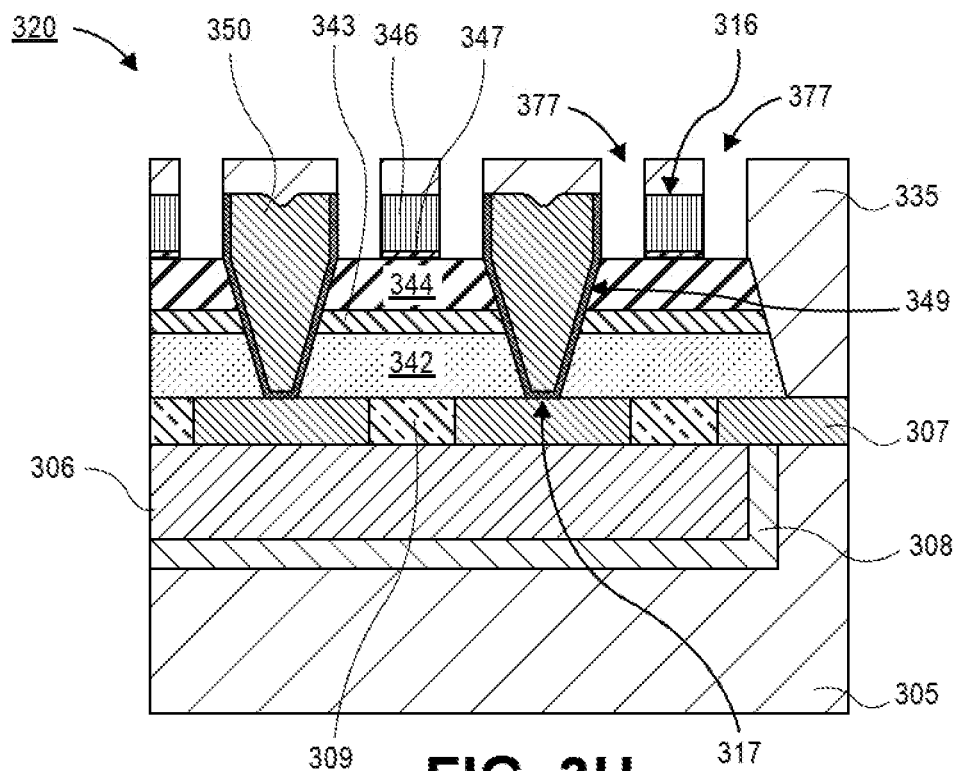
FIG. 3H is a cross-sectional illustration of the e-DRAM array after source and drain openings are formed into the e-DRAM stack, in accordance with an embodiment.

Referring now to FIG. 3H, a cross-sectional illustration of the e-DRAM array region 320 after openings 377 are formed for the source and drain electrodes is shown, in accordance with an embodiment. In an embodiment, the openings 377 may be formed through portions of the second ILD 335, the capping layer 346, and the protection layer 347 to expose a surface of the semiconductor channel 344. In an embodiment, the openings 377 may be formed with standard lithographic patterning and etching operations known in the art.

Figure 3I:
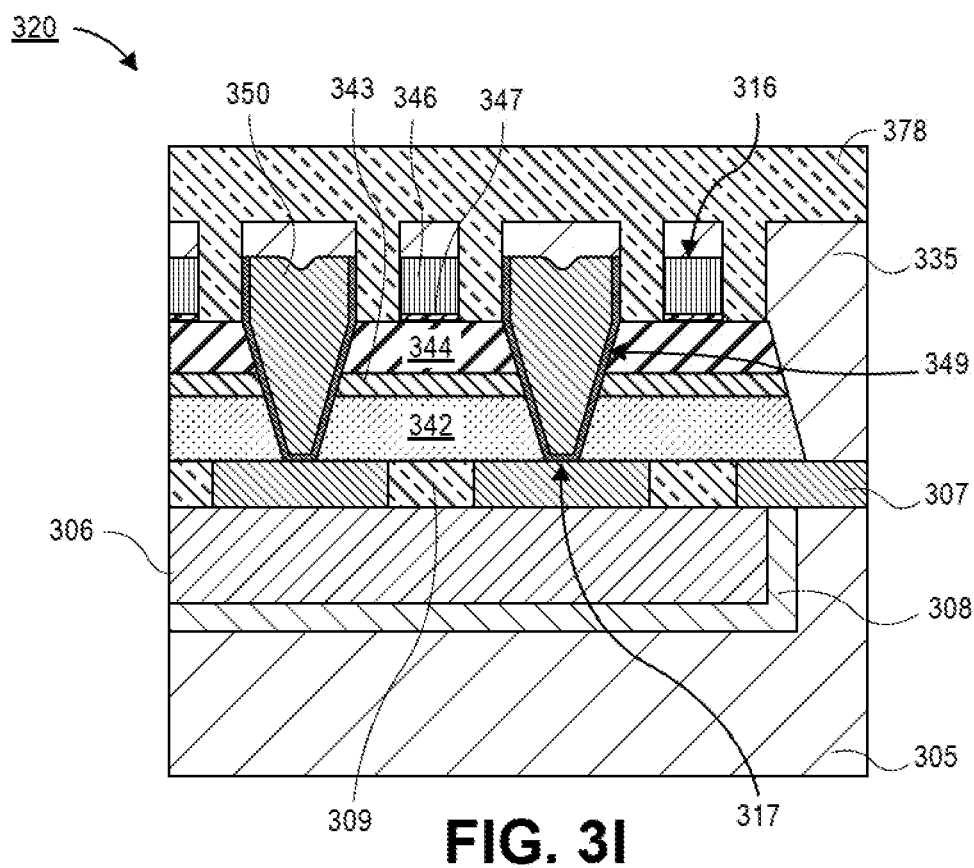
FIG. 3I is a cross-sectional illustration after a conductive material is formed over the e-DRAM array, in accordance with an embodiment.

Referring now to FIG. 3I, a cross-sectional illustration of the e-DRAM region 320 after a conductive layer 378 is formed over the device. In the illustrated embodiment, a single conductive layer 378 is shown. However, it is to be appreciated that one or more additional conductive layers may be used (e.g., barrier layers, work-function layers, or the like).

Figure 3J:
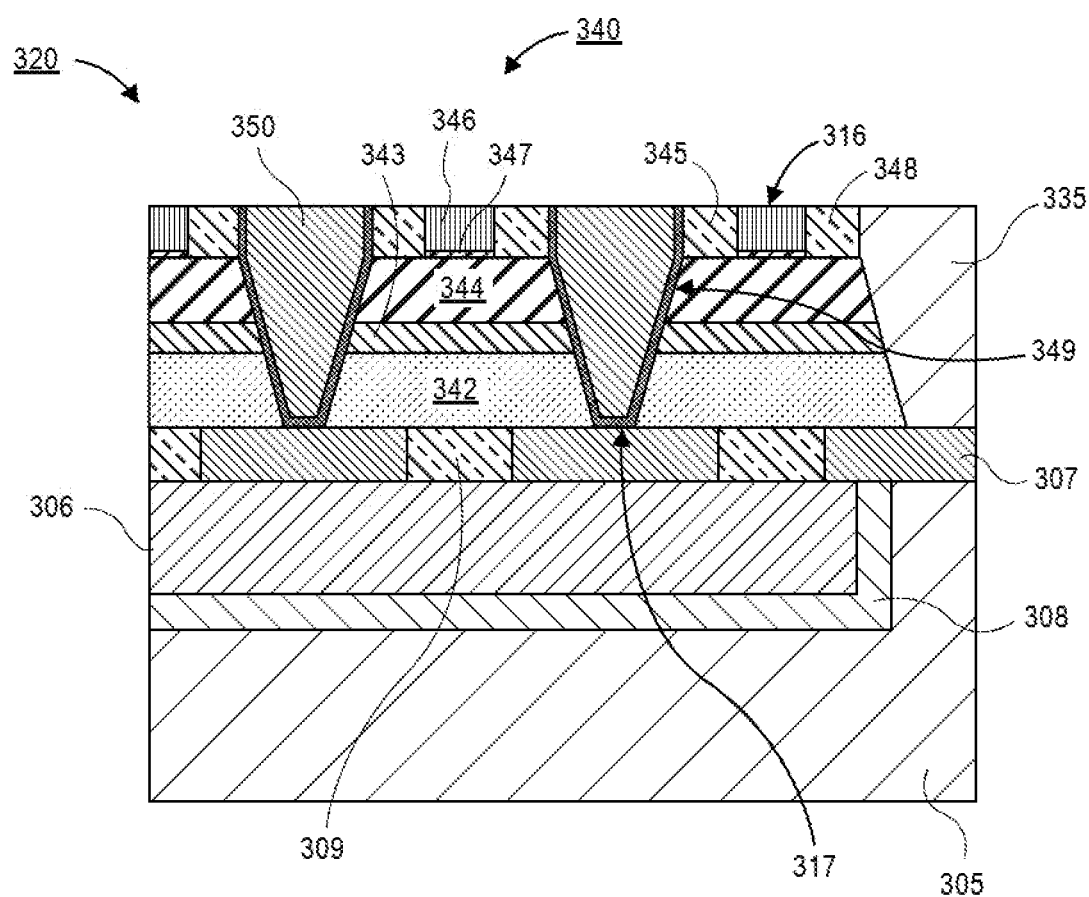
FIG. 3J is a cross-sectional illustration of the e-DRAM array after the conductive material is planarized to form source and drain electrodes, in accordance with an embodiment.

Referring now to FIG. 3J, a cross-sectional illustration of the e-DRAM region 320 after the metal layer 378 is polished is shown, in accordance with an embodiment. In an embodiment, the polishing recesses the metal layer 378 to define a source electrode 345 and a drain electrode 348 on opposite sides of the capping layer 316. After the recessing in FIG. 3J, the fabrication of the semiconductor die 300 may continue with standard BEOL processing in order to provide conductive routing as needed.

Although the preceding methods of fabricating e-DRAM transistors are described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed or both.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 4:
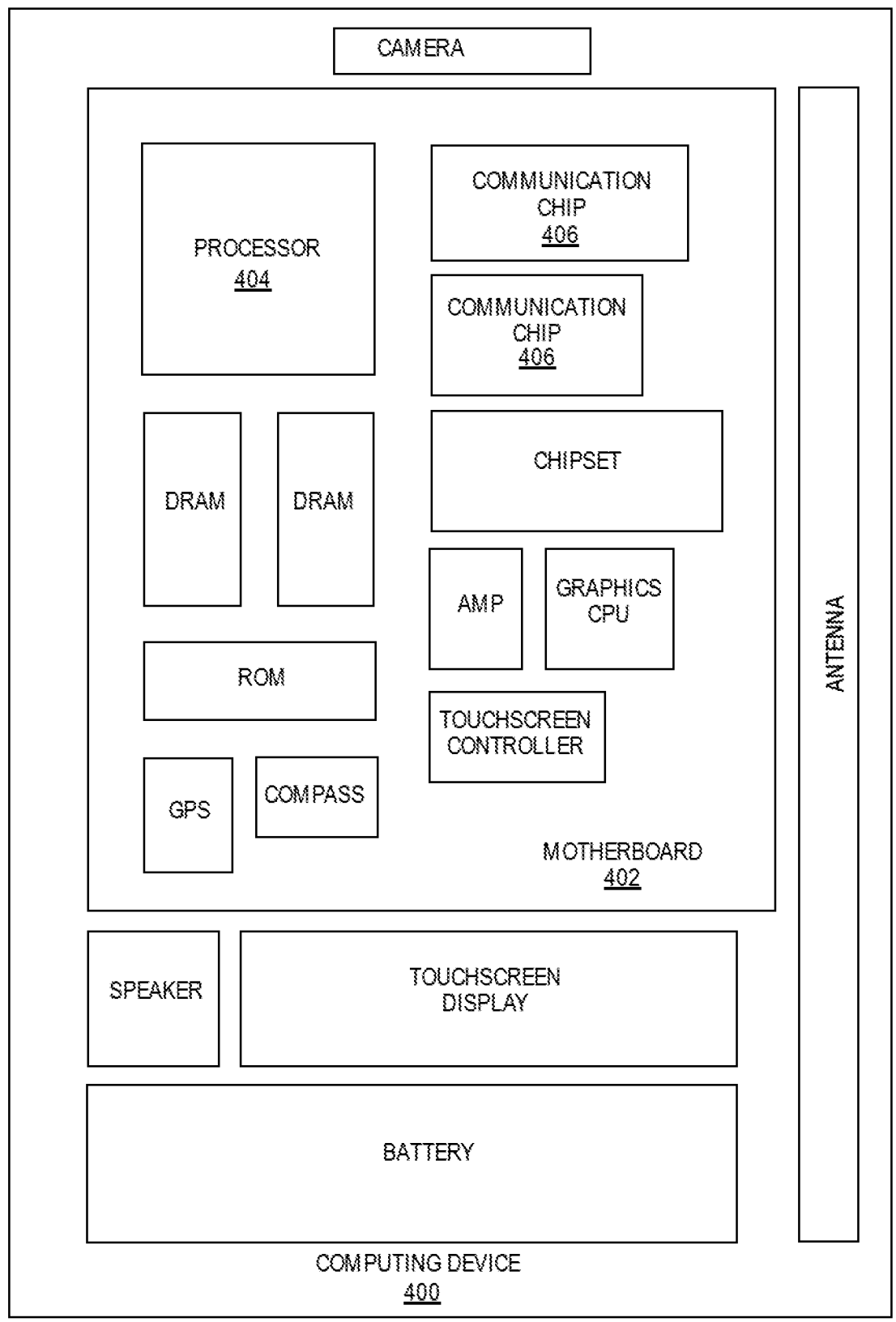
FIG. 4 illustrates a computing device in accordance with one implementation of an embodiment of the disclosure.

FIG. 4 illustrates a computing device 400 in accordance with one implementation of an embodiment of the disclosure. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In an embodiment, the integrated circuit die of the processor includes e-DRAM transistors with a spacer along sidewall surfaces, as described herein. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In an embodiment, the integrated circuit die of the communication chip includes e-DRAM transistors with a spacer along sidewall surfaces, as described herein.

In further implementations, another component housed within the computing device 400 may contain an integrated circuit die that includes e-DRAM transistors with a spacer along sidewall surfaces, as described herein.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
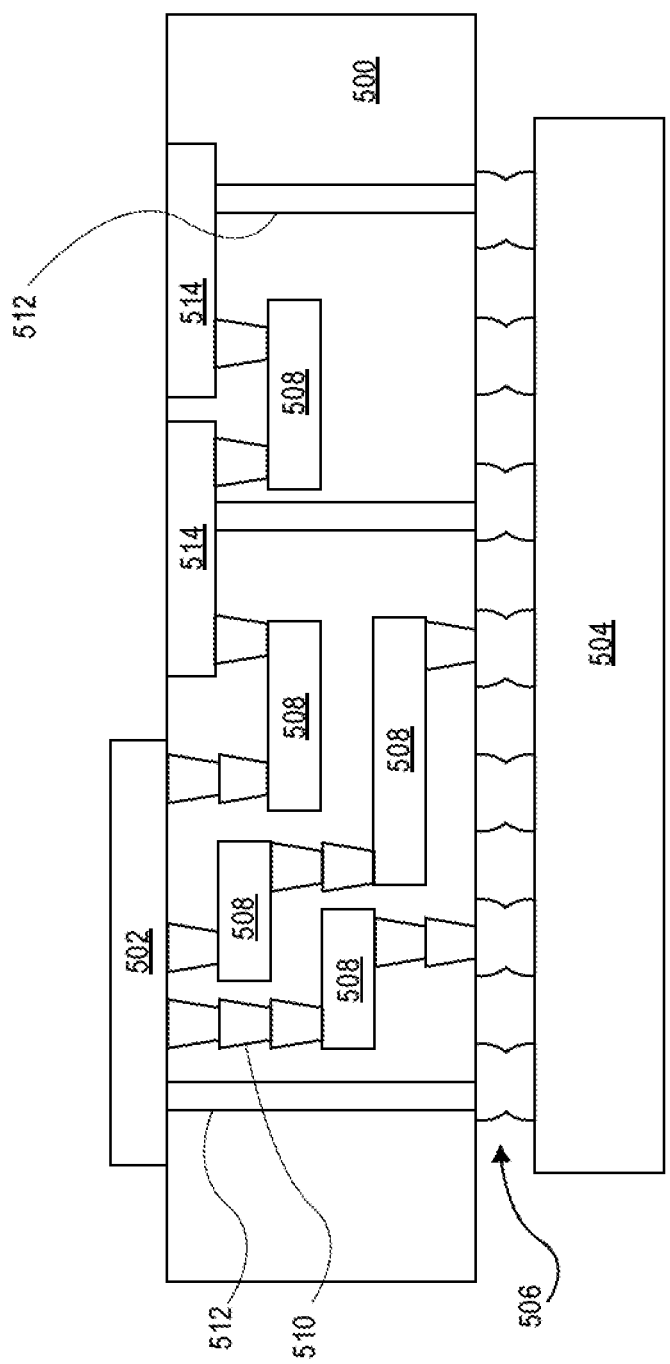
FIG. 5 is an interposer implementing one or more embodiments of the disclosure.

FIG. 5 illustrates an interposer 500 that includes one or more embodiments of the disclosure. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the disclosure, apparatuses or processes disclosed herein may be used in the fabrication of interposer 500.

Thus, embodiments of the present disclosure includes, a semiconductor die comprising e-DRAM transistors with a spacer along sidewall surfaces, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a transistor, comprising: a semiconductor channel with a first surface and a second surface opposite the first surface; a source electrode coupled to the first surface of the semiconductor channel; a drain electrode coupled to the first surface of the semiconductor channel; a gate dielectric over the second surface of the semiconductor channel; a gate electrode separated from the semiconductor channel by the gate dielectric; and an isolation trench adjacent to the semiconductor channel, the isolation trench comprising a spacer lining the surface of the isolation trench, and an isolation fill material.

Example 2: the transistor of Example 1, wherein the spacer directly contacts a third surface of the channel, wherein the third surface of the channel region couples the first surface to the second surface.

Example 3: the transistor of Example 1 or Example 2, wherein the isolation trench is adjacent to surfaces of the channel region, the gate dielectric, and the gate electrode.

Example 4: the transistor of Examples 1-3, wherein the transistor is in the back end of line (BEOL) stack of a semiconductor die.

Example 5: the transistor of Examples 1-4, wherein the transistor is an embedded DRAM transistor.

Example 6: the transistor of Examples 1-5, wherein the spacer comprises hafnium and oxygen.

Example 7: the transistor of Examples 1-6, wherein the semiconductor channel is an oxide semiconductor.

Example 8: the transistor of Examples 1-7, wherein a surface of the isolation trench has a tapered profile.

Example 9: the transistor of Examples 1-8, wherein the spacer has a thickness that is less than approximately 5 nm.

Example 10: a semiconductor die, comprising: a plurality of logic transistors on a semiconductor substrate; a back end of line (BEOL) stack over the semiconductor substrate, wherein the BEOL stack comprises a logic area above the plurality of logic transistors, and an embedded DRAM area adjacent to the logic area, wherein the embedded DRAM area comprises: an array of embedded DRAM transistors, wherein each of the embedded DRAM transistors are isolated from each other by isolation trenches, wherein the isolation trenches comprise a spacer lining the surface of the isolation trench, and an isolation fill material.

Example 11: the semiconductor die of Example 10, wherein the spacer in each of the isolation trenches directly contacts a surface of a semiconductor channel of the DRAM transistors.

Example 12: the semiconductor die of Example 10 or Example 11, wherein the spacer comprises hafnium and oxygen.

Example 13: the semiconductor die of Examples 10-12, wherein the spacer has a thickness of approximately 5 nm or less.

Example 14: the semiconductor die of Examples 10-13, wherein the embedded DRAM transistors each comprise a thin film semiconductor channel, and wherein the logic area of the BEOL does not comprise any of the thin film semiconductor material.

Example 15: the semiconductor die of Examples 10-14, wherein each embedded DRAM transistor comprises: a semiconductor channel with a first surface and a second surface opposite the first surface; a source electrode contacting the first surface of the semiconductor channel; a drain electrode contacting the first surface of the semiconductor channel; a gate dielectric over the second surface of the semiconductor channel; and a gate electrode separated from the semiconductor channel by the gate dielectric.

Example 16: the semiconductor die of Examples 10-15, wherein the isolation trenches are adjacent to the semiconductor channel, and wherein the spacer directly contacts the semiconductor channel.

Example 17: the semiconductor die of Examples 10-16, wherein a profile of the trenches is tapered.

Example 18: a method of forming a semiconductor device, comprising: forming a transistor stack over an etchstop layer in the back end of line (BEOL) stack of a semiconductor die, wherein the transistor stack comprises: a gate electrode; a gate dielectric over the gate electrode; a semiconductor channel over the gate dielectric; and a capping layer over the semiconductor channel; forming an isolation trench through the transistor stack; forming a spacer layer over surfaces of the isolation trench, over the capping layer, and over the etchstop layer; filling the isolation trench with a fill material; recessing the fill material to expose the spacer layer over the capping layer and over the etchstop layer; treating the spacer layer, wherein treating the spacer layer changes an etch resistance of the spacer layer; removing the exposed portions of the spacer layer; and forming an interlayer dielectric (ILD) over the transistor stack and the etchstop layer.

Example 19: the method of Example 18, further comprising: forming source and drain openings through the ILD and the capping layer; and forming source and drain electrodes in the source and drain openings.

Example 20: the method of Example 18 or Example 19, wherein the sidewall surfaces of the source and drain electrodes contact the spacer layer.

Example 21: the method of Examples 18-20, wherein the spacer comprises hafnium oxide.

Example 22: the method of Examples 18-21, wherein treating the spacer layer comprises: implanting a dopant into the spacer layer.

Example 23: the method of Examples 18-22, wherein the dopant is silicon, boron, carbon, or fluorine.

Example 24: a computing system, comprising: a motherboard; a semiconductor die electrically coupled to the motherboard, wherein the semiconductor die comprises: a plurality of logic transistors on a semiconductor substrate; a back end of line (BEOL) stack over the semiconductor substrate, wherein the BEOL stack comprises a logic area above the plurality of logic transistors, and an embedded DRAM area adjacent to the logic area, wherein the embedded DRAM area comprises: an array of embedded DRAM transistors, wherein each of the embedded DRAM transistors are isolated from each other by isolation trenches, wherein the isolation trenches comprise a spacer lining the surface of the isolation trench, and an isolation fill material filling the isolation trench.

Example 25: the computing system of Example 24, wherein the computing system is a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

What is claimed is:

1. A transistor, comprising:
   a semiconductor channel with a first surface and a second surface opposite the first surface;

a source electrode coupled to the first surface of the semiconductor channel;

a drain electrode coupled to the first surface of the semiconductor channel;

a gate dielectric over the second surface of the semiconductor channel;

a gate electrode separated from the semiconductor channel by the gate dielectric;

an isolation trench adjacent to the semiconductor channel, the isolation trench comprising a spacer lining a surface of the isolation trench, and an isolation fill material, and the isolation trench extending entirely through the gate electrode;

an etch-stop layer beneath the gate electrode and beneath the isolation trench; and a via in the etch-stop layer, the via in contact with a bottom surface of the gate electrode.

2. The transistor of claim 1, wherein the spacer directly contacts a third surface of the semiconductor channel, wherein the third surface of the semiconductor channel couples the first surface to the second surface.

3. The transistor of claim 1, wherein the isolation trench is adjacent to surfaces of the channel region, the gate dielectric, and the gate electrode.

4. The transistor of claim 1, wherein the transistor is in a back end of line (BEOL) stack of a semiconductor die.

5. The transistor of claim 4, wherein the transistor is an embedded DRAM transistor.

6. The transistor of claim 1, wherein the spacer comprises hafnium and oxygen.

7. The transistor of claim 1, wherein the semiconductor channel is an oxide semiconductor.

8. The transistor of claim 1, wherein a surface of the isolation trench has a tapered profile.

9. The transistor of claim 1, wherein the spacer has a thickness that is less than approximately 5 nm.

* * * * *